United States Patent
Lee

(10) Patent No.: US 7,468,301 B2
(45) Date of Patent: Dec. 23, 2008

(54) PMOS TRANSISTOR WITH INCREASED EFFECTIVE CHANNEL LENGTH IN THE PERIPHERAL REGION AND A MULTI-HEIGHT SUBSTRATE

(75) Inventor: Jin Yul Lee, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 81 days.

(21) Appl. No.: 11/302,055

(22) Filed: Dec. 12, 2005

(65) Prior Publication Data

US 2006/0186487 A1 Aug. 24, 2006

(30) Foreign Application Priority Data

Feb. 23, 2005 (KR) .................. 10-2005-0014860

(51) Int. Cl.
 *H01L 21/336* (2006.01)
 *H01L 29/80* (2006.01)
(52) U.S. Cl. ............... 438/294; 257/250; 257/411; 257/E29.028; 438/296
(58) Field of Classification Search ........ 257/250, 257/E20.028, 411, 213–413, E29.028; 438/294, 438/296
See application file for complete search history.

(56) References Cited

U.S. PATENT DOCUMENTS

| 6,828,188 B2 * | 12/2004 | Hirota et al. ............ 438/238 |
| 2004/0108559 A1 * | 6/2004 | Sugii et al. ............ 257/411 |
| 2004/0245563 A1 * | 12/2004 | Forbes ............ 257/315 |

FOREIGN PATENT DOCUMENTS

| JP | 7-302902 | 11/1995 |
| JP | 2002-313950 | 10/2002 |

* cited by examiner

*Primary Examiner*—Thanh V. Pham
*Assistant Examiner*—Alexander Belousov
(74) *Attorney, Agent, or Firm*—Ladas & Parry LLP

(57) ABSTRACT

In manufacturing a PMOS transistor, a semiconductor substrate having an active region and a field region is formed with a hard mask layer, which covers a center portion of the active region on the substrate in a lengthwise direction of a channel. The hard mask layer exposes the center portion of the active region in a widthwise direction of the channel and covers both edges of the substrate and the field region adjacent to the both edges. The substrate is etched to a predetermined depth using the hard mask layer as an etching barrier. The hard mask layer is then removed. A gate covering the center portion of the active region is formed on the lengthwise direction of the channel. Source and drain regions are formed at both edges of the gate.

14 Claims, 8 Drawing Sheets

Field Region   Active Region   Field Region

Field Region   Active Region   Field Region

Channel Width Direction

Channel Length Direction

Channel Width Direction

Channel Length Direction

PMOS TRANSISTOR WITH INCREASED EFFECTIVE CHANNEL LENGTH IN THE PERIPHERAL REGION AND A MULTI-HEIGHT SUBSTRATE

BACKGROUND OF THE INVENTION

1. Field of the Invention

The present invention relates generally to a method of manufacturing a semiconductor device, and more particularly to a PMOS transistor and a method of manufacturing the same with increased effective length of a channel in a peripheral region of the PMOS transistor.

2. Description of the Prior Art

As the semiconductor devices are reduced at a level less than 100 nm, the important issues are to securing a margin of a threshold voltage Vt of a peripheral region of a PMOS transistor and reducing the leakage of the off current.

Unlike a CMOS transistor which must implement both NMOS and PMOS devices in a peripheral region, a PMOS transistor device is realized by a buried channel, which is advantageous in that the carriers have high mobility allowing a large operational current in the buried channel rather than near the surface of the transistor. However, shorter the length of the channel, the characteristics of the off current leakage become worse.

Further, electrons created by the holes that are carriers of the PMOS transistor are implanted in a gate oxide layer or an isolation layer. Even when a gate is turned off, such implanted electrons cause the channel of the PMOS transistor to be inverted, and this reduces the effective length of the channel. This phenomenon is referred to as a hot electron induced punch-through (HEIP). The HEIP increases the existing off current, which increases the consumption of electricity of the transistor.

Also, there is a problem in that the HEIP affects the operational speed and the other electric characteristics such as the decrease and deterioration of punch-through voltage of the PMOS transistor.

FIG. 1A is a plan view for illustrating a HEIP occurring in a PMOS transistor according to a conventional art, FIGS. 1B and 1C are cross-sectional views for taken along the lines I-I' and II-II' in FIG. 1A.

As shown in FIGS. 1A to 1C, the HEIP is the phenomenon that decrease the effective length of the channel by inverting the channel of the PMOS transistor by electrons caused at the both edge of lengthwise direction and widthwise direction of the channel.

Attempting to solve these problems, various conventional plans have been proposed. As shown in FIG. 2, One conventional plan proposes installation of a gate tap 6 in a region in which a reduction of the channel has arisen, but not in a whole gate line 3, thereby preventing a reduction of the effective length of the channel.

In FIGS. 1A to 1C and 2, a reference numeral "1" denotes a semiconductor substrate, a reference numeral "2" indicates a isolation layer, a reference numeral "3a" denotes a gate oxide layer, a reference numeral "3b" denotes a gate conductive layer, a reference numeral "3c" denotes a hard mask layer, a reference numeral "4" indicates a spacer, a reference numeral "5a" indicates a source region, and a reference numeral "5b" indicates a drain region.

However, with respect to the design rule for integration of the semiconductor devices reduced at a level less than 80 nm, it is difficult to secure a space in which a gate tap is to be installed. Hence, there is a limitation to overcome a deterioration of electric characteristics of the PMOS device.

SUMMARY OF THE INVENTION

Accordingly, the present invention has been developed in order to solve the above-mentioned problems occurring in the prior art, and an object of the present invention is to provide a PMOS transistor and a method of manufacturing the same, which is capable of increasing the length of a channel in the PMOS transistor to compensate for a reduction of an effective length of the channel caused by a hot electron induced punch-through, thereby improving an electric characteristic.

In order to accomplish these objects of the present invention, there is provided a PMOS transistor comprising a channel, which have convex areas on the both side areas in a widthwise direction of the channel.

Also, In order to accomplish these objects of the present invention, there is provided a method of manufacturing a PMOS transistor, which includes the steps of: providing a semiconductor substrate which has an active region and a field region defined in the semiconductor substrate; forming an isolation layer in the field region of the semiconductor substrate; forming a hard mask layer on the semiconductor substrate, which covers both side areas widthwise directional of a center portion in a lengthwise direction of a channel, and which covers also the field region adjacent to the side areas, but which exposes the other regions which include the center portion of the active region in a widthwise direction of the channel; etching the semiconductor substrate by using the hard mask layer as an etching barrier, so as to recess the semiconductor substrate; removing the hard mask layer; forming a gate covering the center portion of the active region in the lengthwise direction of the channel after completion of the removal of the hard mask layer; and forming source and drain regions at both edges of the gate on a surface of the semiconductor substrate.

According to the present invention, the step of forming the isolation layer includes the sub-steps of: forming a pad oxide layer and a pad nitride layer sequentially to expose the field region on the semiconductor substrate having the active region and the field region defined in the substrate; etching the semiconductor substrate by using the pad nitride layer as an etching barrier, so as to form a trench; forming a gap-fill oxide layer on the resultant in order to bury the trench; performing a chemical and mechanical polishing for the gap-fill oxide layer until the pad nitride layer is exposed; and removing the remaining pad nitride layer and pad oxide layer after the chemical and mechanical polishing.

According to the present invention, the pad oxide layer has a thickness of 50~150 Å.

According to the present invention, the pad nitride layer has a thickness of 500~700 Å.

According to the present invention, the trench has a depth of 2000~3000 Å.

According to the present invention, the hard mask layer is an oxide layer.

According to the present invention, the hard mask layer is formed to have a thickness of 50~100 Å.

According to the present invention, the step of recessing the semiconductor substrate is performed in order for a recess to have a depth of 400~600 Å.

According to the present invention, a gate oxide layer, a doped polysilicon layer, a tungsten silicide layer, and a gate hard mask layer are sequentially stacked to form the gate.

According to the present invention, the gate oxide layer has a thickness of 30~50 Å.

According to the present invention, the doped polysilicon layer has a thickness of 400~700 Å.

According to the present invention, the tungsten silicide has a thickness of 1000~1500 Å.

According to the present invention, the gate hard mask layer has a 2000~2500 Å.

BRIEF DESCRIPTION OF THE DRAWINGS

The above and other objects, features, and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings.

FIGS. 3A to 3G are cross-sectional views for illustrating a method of manufacturing a PMOS transistor according to an embodiment of the present invention, in which processes of the method are shown step by step.

Figure 3A:
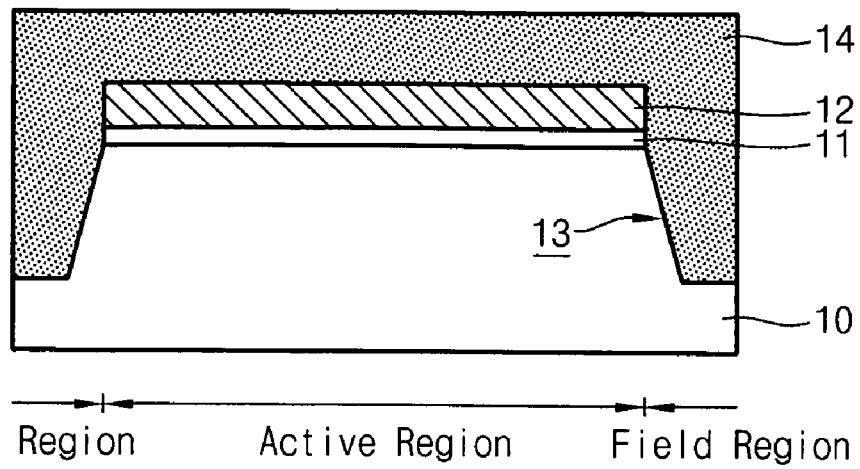
FIGS. 3A to 3G are cross-sectional views for illustrating a method of manufacturing a PMOS transistor according to an embodiment of the present invention, in which processes of the method are shown step by step (where FIG. 3C is a cross-sectional view taken along the line III-III' in FIG. 4 and where FIG. 3D is a cross-sectional view taken along the line IV-IV' of FIG. 5.)

As shown in FIG. 3A, a semiconductor substrate 10 has an active region and a field region defined therein. A pad oxide layer 11 and a pad nitride layer 12 are sequentially formed on the semiconductor substrate 10 in order to expose the field region. The pad oxide layer 11 has a thickness of 50~150 Å, and the pad oxide layer 12 has a thickness of 500~700 Å. Next, the semiconductor substrate 10 is etched using the pad nitride layer 12 as an etching barrier, so as to form a trench 13. The trench 13 has a depth of 2,000~3,000 Å. Then, an oxide layer 14 for a gap-fill is formed on the resultant in order to bury the trench 13.

Figure 3B:
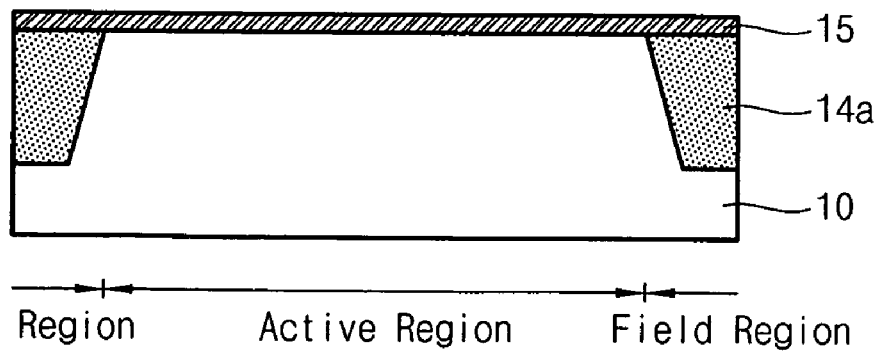

As shown in FIG. 3B, the oxide layer 14 for the gap-fill is polished using a chemical and mechanical polishing (CMP) method until the pad nitride 12 is exposed. Then, the remaining pad nitride layer 12 and pad oxide layer 11 are removed to form an isolation layer 14a. Next, an oxide layer 15 for a hard mask layer is formed on the semiconductor substrate 10 in which the isolation layer 14a. The oxide layer 15 for the hard mask layer is formed to have a thickness of 50~100 Å.

Figure 3C:
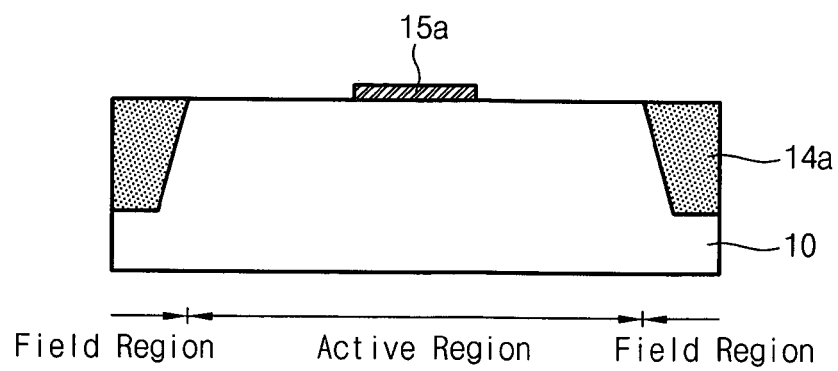
Figure 4:
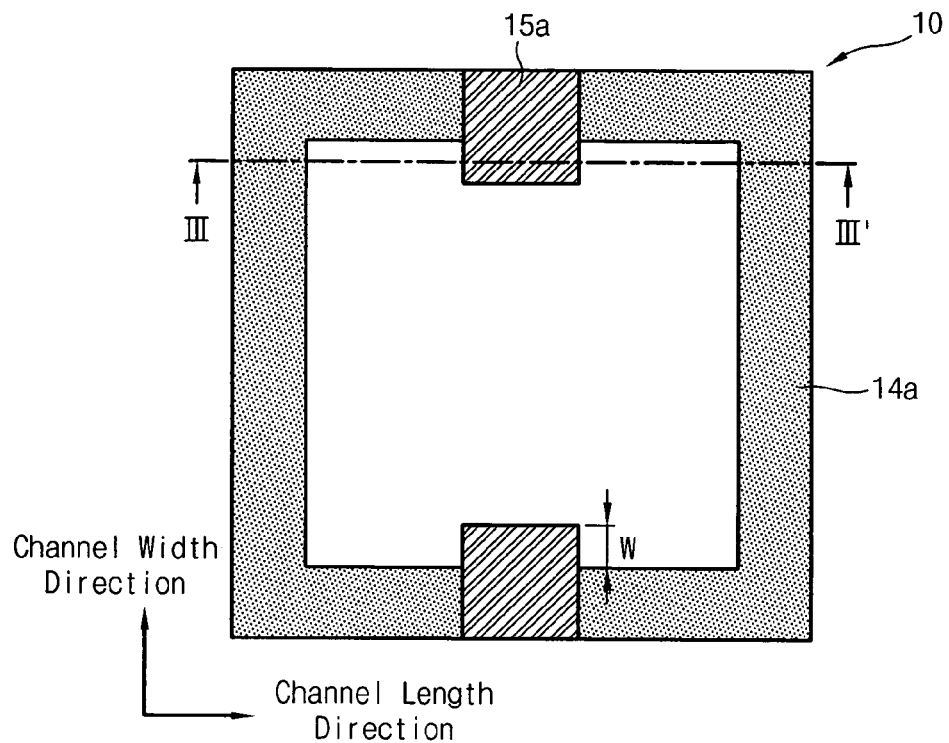
FIG. 4 is a plan view showing a semiconductor substrate according to an embodiment of the present invention, in which processes are completed until a step of FIG. 3C.

As shown in FIGS. 3C and 4, the oxide layer 15 for the hard mask layer is selectively etched, so as to form the hard mask layer 15a which covers a center portion of the active region in a lengthwise direction of a channel and exposes the center portion of the active region in a widthwise direction of the channel, while covering both edges and portions of the field region adjacent to the both edges. Here, FIG. 3C is a cross-sectional view showing the semiconductor substrate 10 of FIG. 4 taken along the line III-III' (i.e., this line is in the lengthwise direction of the channel). In FIG. 4, a reference letter W indicates a width of the hard mask layer 15a covering the active region. A dimension of the width can be adjusted in a process for etching the oxide layer 15 for the hard mask layer.

Figure 3D:
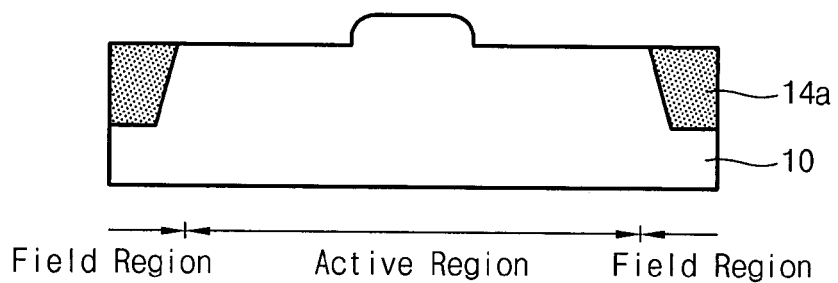
Figure 5:
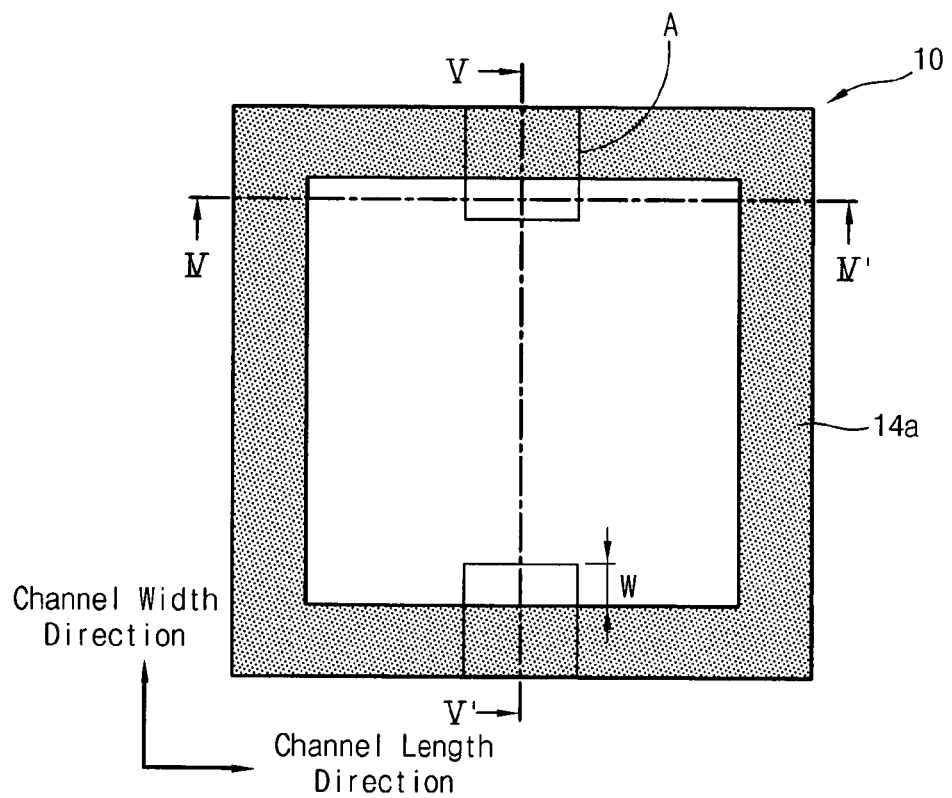
FIG. 5 is a plan view showing the semiconductor substrate according to an embodiment of the present invention, in which processes has been completed up to a step shown in FIG. 3D.
Figure 6:
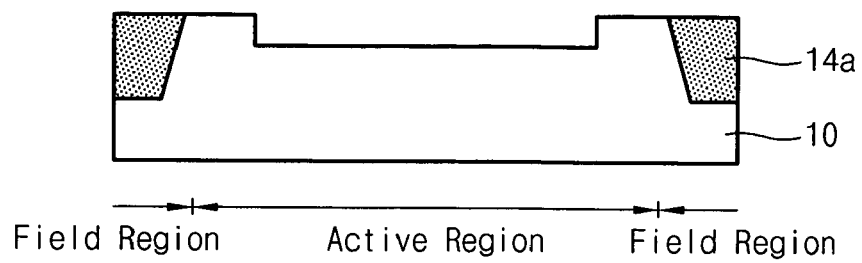
FIG. 6 is a cross-sectional view showing the semiconductor substrate according to the present invention, taken along a line V-V' of FIG. 5.

Now referring to FIG. 3D, the surface of semiconductor substrate 10 having the isolation layer 14a surrounding the active region with two hard mask layers 15a formed at the ends of the lengthwise direction of the channel as shown in FIG. 4 is etched and recessed by using the hard mask layer 15a as an etching barrier. The process of recessing the semiconductor substrate 10 is performed until the substrate surface 10 not covered by the etching barriers 15a is recessed to a depth of 400~600 Å. The hard mask layer 15a is removed thereafter. Here, FIG. 5 is a plan view showing the semiconductor substrate according to an embodiment of the present invention, in which the processes have been completed up to FIG. 3D. FIG. 6 is a cross-sectional view showing the semiconductor substrate according to an embodiment of the present invention taken along the line V-V' (a widthwise direction of the channel) of FIG. 5. Further, FIG. 3D is a cross-sectional view showing the semiconductor substrate taken along a line IV-IV' (the lengthwise direction of the channel) of FIG. 5.

During the recessing process as described above with respect to FIG. 3D, the PMOS according to an embodiment of the present invention is formed with convex areas corresponding to the areas below the hard mask patterns 15a (see FIG. 3C) such that the length of the channel increase in the lengthwise direction and in widthwise direction of the channel. Thus, when the above mentioned process is performed, it is possible to overcome a limitation of a margin in the process to which a conventional gate tap structure is applied, and secure the length of the channel which is necessary for an operation of a PMOS transistor, thereby remarkably reducing the off current leakage when the gate is turned off and also minimizing the loss of operational voltage. Although the term "convex areas" is chosen to describe the areas in FIG. 3D remaining after the etching process using the hard mask patterns 15a, it is noted that the term was not chosen to convey a specific shape (such as being convex or rounded) of the "convex areas" as shown in FIG. 3D. It is noted that HEIP may occur at the edges in both lengthwise and widthwise directions of the channel. The effective channel length is compensated by forming the convex areas as described with respect to FIG. 3D respectively on both edges in the lengthwise direction and the widthwise direction according to an embodiment of the present invention. Therefore, it has no technical significance whether the convex areas as described herein is limited just to the shape of being "convex" or having rounded edges. Other shapes may also be possible.

Further, the length of the channel, which is increased by the recessing process, can be adjusted by varying the width W (FIG. 5) of the hard mask layer 15a covering the active region, and/or by varying the depth of the recess in the substrate 10. Therefore, even if there is a large effect in which the length of the channel is reduced by a hot electron induced punch-through (HEIP), a desired length of the channel can be obtained by adjusting the width W of the hard mask layer 15a and the depth of the recess. Thus, it is possible to sufficiently compensate for the reduction in the effective length of the channel caused by the HEIP. Thus, it is possible to prevent the reduction of the threshold voltage and prevent an increase in the off current caused by the HEIP. Accordingly, punch-through voltage and current consumption can be reduced, while the operation speed can be improved.

The reference letter A of FIG. 5 denotes the regions, which are not recessed, due the hard mask layers 15a (now removed) formed on the regions A that prevented recessing. Next, after removal of the hard mask layer 15a, a screen oxide layer (not shown) is formed on the semiconductor substrate 10 as shown in FIG. 5. In turn, the well ion implantation and a channel ion implantation processes are sequentially carried out by known techniques. Then, the screen oxide layer (not shown) is removed.

Figure 3E:
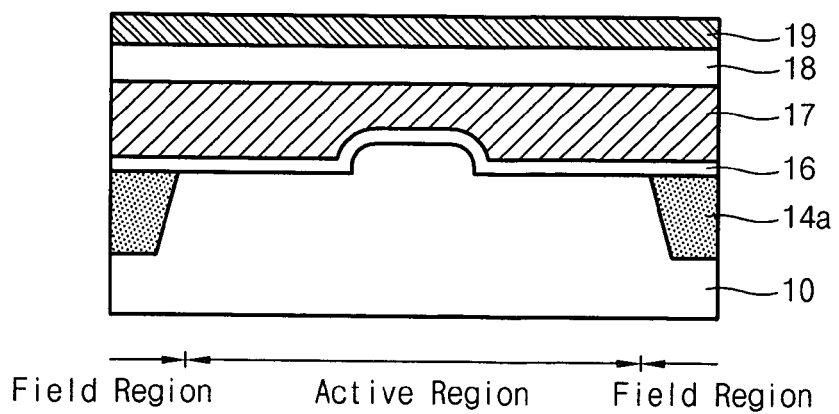

As shown in FIG. 3E, a gate oxide layer 16, a doped polysilicon layer 17, a tungsten silicide layer 18, and a gate hard mask layer 19 are sequentially formed. The gate oxide layer 16 is formed to have a thickness of 30~50 Å, and the doped polysilicon layer 17 is formed to have 400~700 Å. Further, the tungsten silicide layer 18 has a thickness of 1000~1500 Å, and the gate hard mask layer 19 has a thickness of 2000~2500 Å.

Figure 1A:
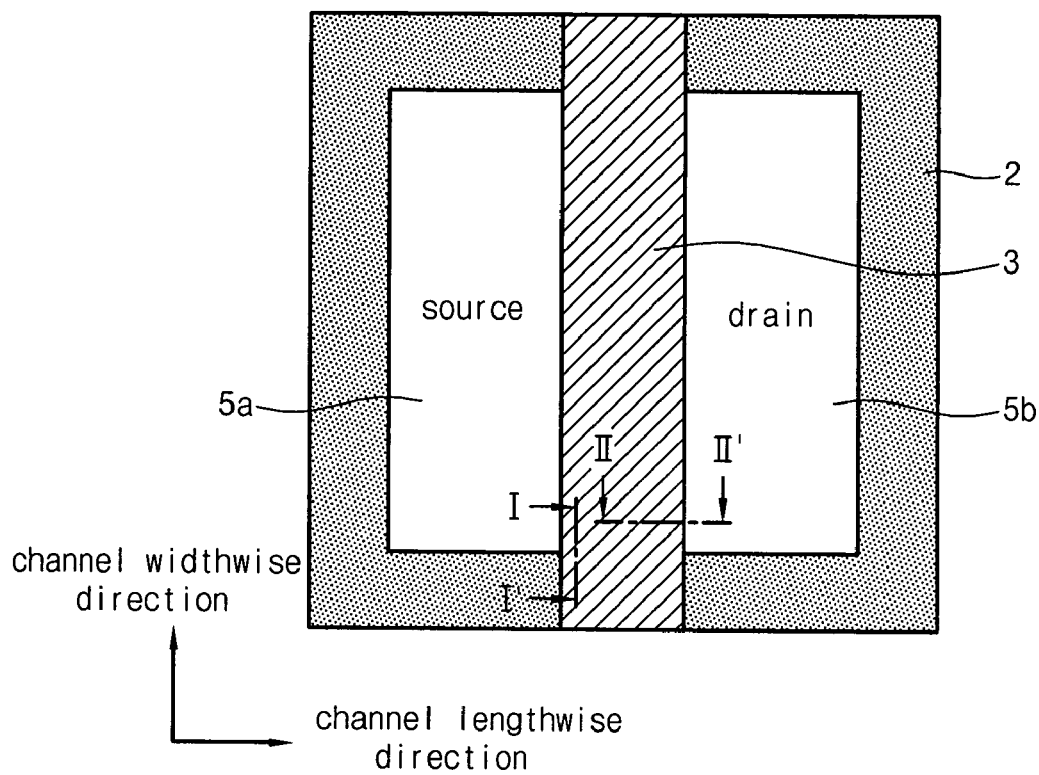
FIG. 1A is a plan view for illustrating a HEIP occurring in a PMOS transistor according to a conventional art.
Figure 1B:
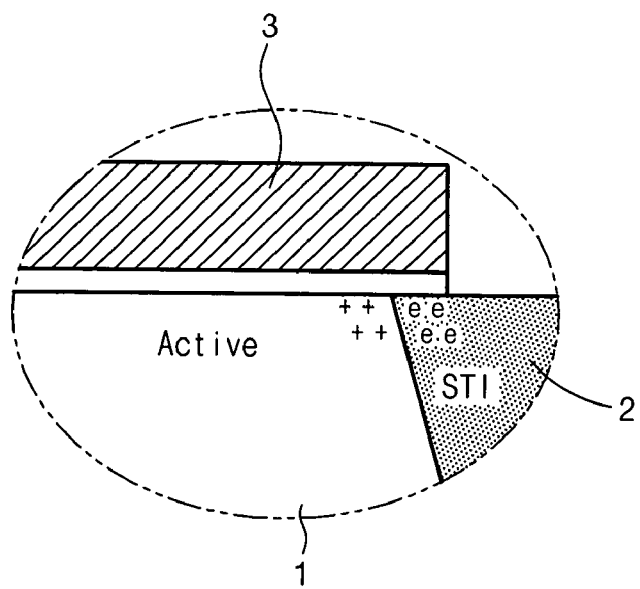
FIGS. 1B and 1C are cross-sectional views for taken along the lines I-I' and II-II' in FIG. 1A.
Figure 1C:
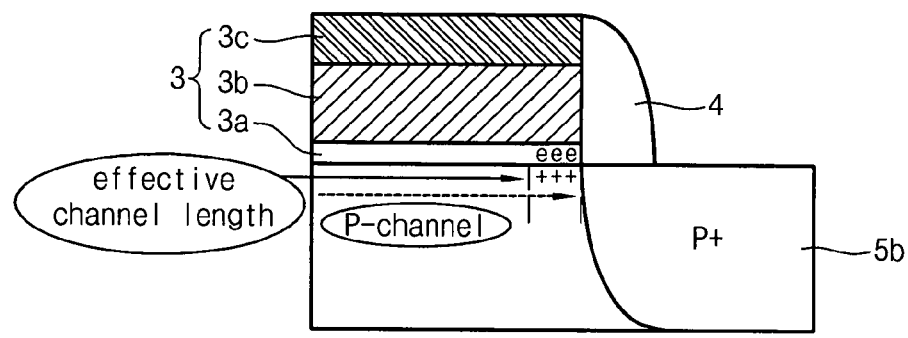
Figure 2:
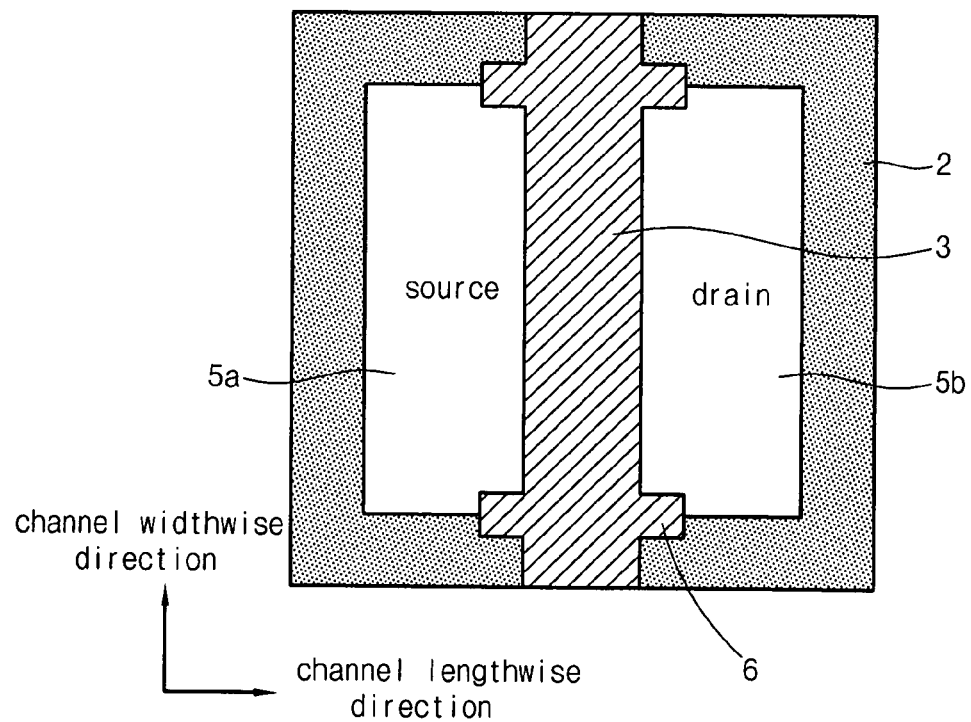
FIG. 2 is a plan view showing a PMOS transistor according to other conventional art.
Figure 3F:
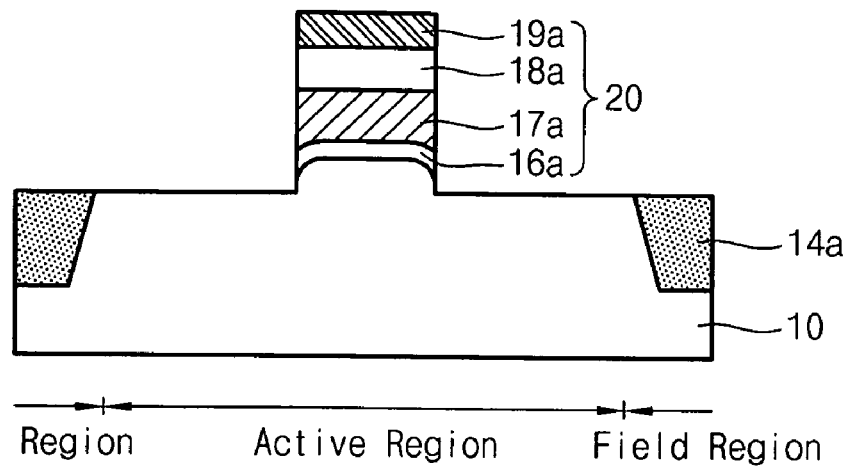
Figure 7:
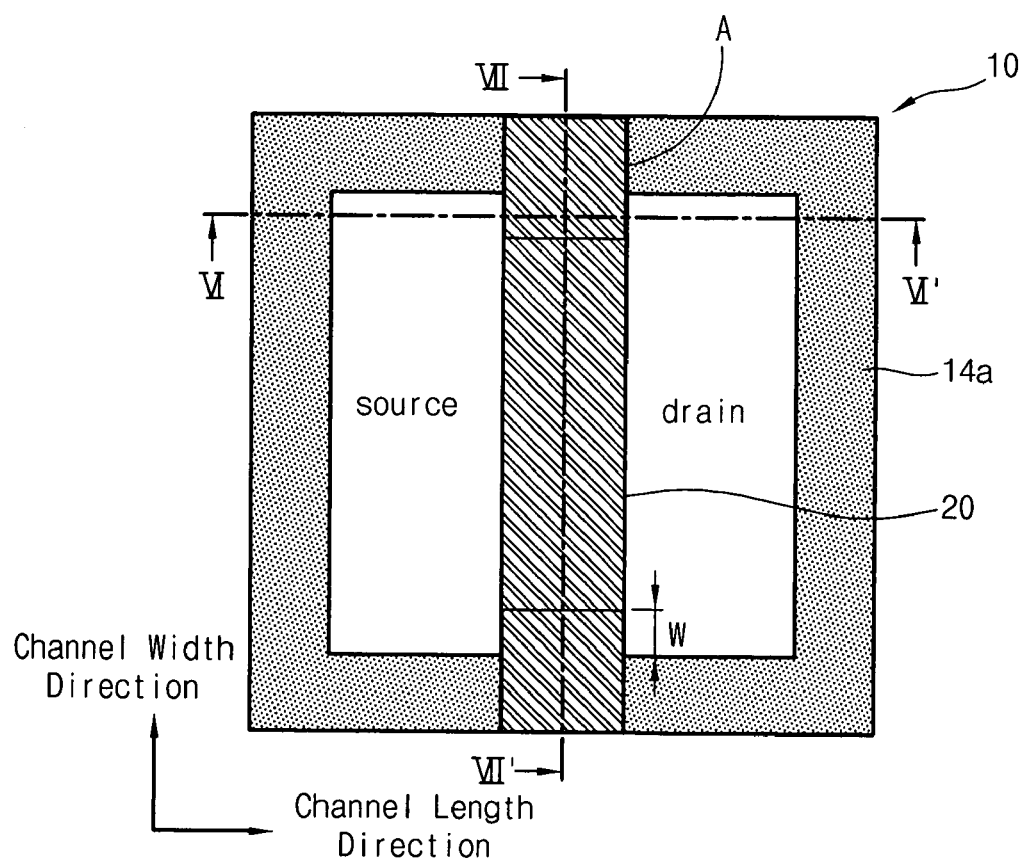
FIG. 7 is a plan view showing the semiconductor substrate according to an embodiment of the present invention, in which processes has been completed up to a step shown in FIG. 3F.
Figure 8:
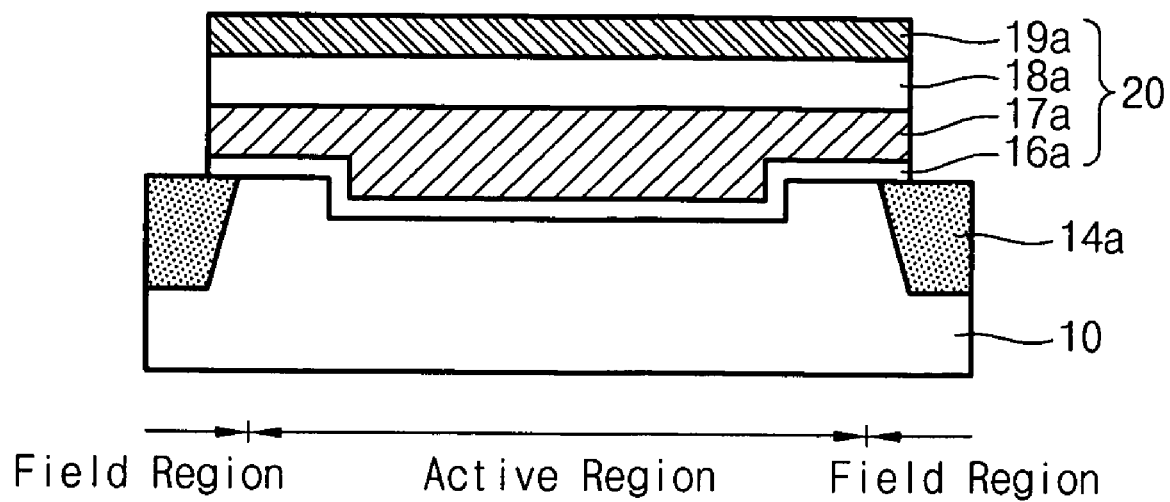
FIG. 8 is a cross-sectional view showing the semiconductor substrate according to an embodiment of the present invention, taken along a line VII-VII' of FIG. 7.

As shown in FIGS. 3F, 7, and 8, the gate hard mask layer 19, the tungsten silicide layer 18, the doped polysilicon layer 17, and the gate oxide 16 are selectively etched in order to form a gate 20 which covers a center portion of the active region in the lengthwise direction of the channel. Here, FIG. 7 is a plan view showing the semiconductor substrate according to an embodiment of the present invention, in which processes has been completed up to the step shown in FIG. 3F, FIG. 8 is a cross-sectional view showing the semiconductor substrate according to an embodiment of the present invention, taken along a line VII-VII' (a widthwise direction of the channel) of FIG. 7, and FIG. 1F is a cross-sectional view showing the semiconductor substrate, taken along a line VI-VI' (the lengthwise direction of the channel) of FIG. 7. In FIG. 3F, a reference character 16a denotes a remaining gate oxide layer after etching, a reference character 17a indicates a remaining doped polysilicon layer after etching, a reference character 18a indicates a remaining tungsten silicide layer after etching, and a reference character 19a denotes a remaining gate hard mask layer.

Figure 3G:
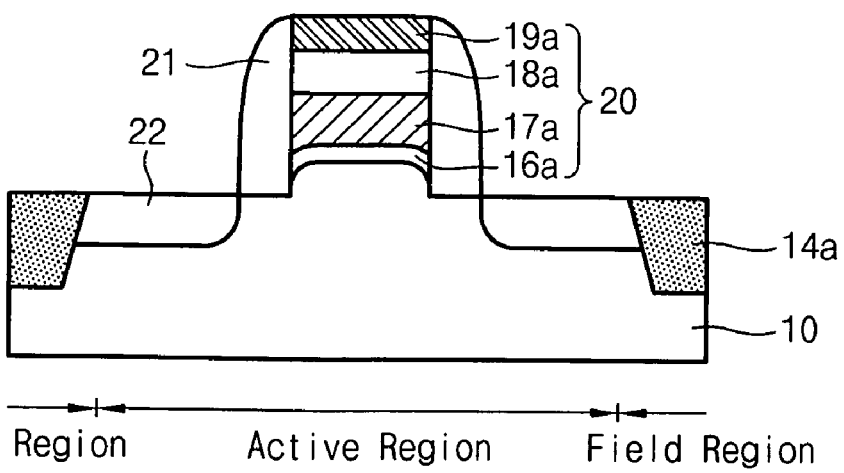

As shown in FIG. 3G, spacers 21 are formed on both sidewalls of the gate 20. Next, P-type impurity is ion-implanted in a surface of the substrate 10 around both sides of the gate 20 including the spacers 21, so as to form source and drain regions 22.

In an embodiment of the present invention as described above, the hard mask layer (such as 15a) is formed in order to cover the center portion of the active region on the semiconductor substrate in the lengthwise direction of the channel (such as shown in FIG. 4), which expose the center portion of the active region in the widthwise direction of the channel and covers both edges and the field region adjacent to the both edges. Then, portions of the substrate, which are exposed by the hard mask layer, are recessed, so as to increase the length of the channel in the widthwise and lengthwise directions of the channel (such as the areas A shown in FIG. 5). Thus, it is possible to overcome a limitation of a margin in the process to which a conventional gate tap structure is applied, and suffi-ciently compensate for the reduction in the effective length of the channel caused by the HEIP. Furthermore, it is possible to prevent the reduction of the threshold voltage and prevent the increase in the off current. Accordingly, a punch-through voltage and a current consumption can be decreased, while the operation speed can be improved.

As a result, the electric characteristics of a transistor are improved as disclosed in accordance with an embodiment of the present invention.

While a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method of manufacturing a PMOS transistor, comprising the steps of:

providing a semiconductor substrate having an active region, a first mask area, a second mask area and a field region, the field region having a first field area and a second field area;

wherein a channel area is formed by the first field area, the second field area, and a predetermined portion of the active region between the first and second field areas, and wherein the first mask area consists of the first field area and a first portion of the active region extending from the first field area, wherein the second mask area consists of the second field area and a second portion of the active region extending from the second field area;

forming an isolation layer in the field region of the semiconductor substrate;

forming a first hard mask layer on the first mask area only; forming a second hard mask layer on the second mask area only;

etching the field region, the active region, and the predetermined portion of the active region between the first and second field areas of the semiconductor substrate to a predetermined depth by using the first and second hard mask layers as an etching barrier, wherein the predetermined depth exists between the surface of the first and second field areas and the rest of the active and field regions of the semiconductor substrate;

removing the first and second hard mask layers;

forming a gate on the channel area and the first and second field areas after etching the field region, the active region, and the predetermined portion of the active region between the first and second field areas; and forming source and drain regions at both edges of the gate on a surface of the semiconductor substrate.

2. The method of claim 1, wherein the step of forming the isolation layer includes the sub-steps of:

forming a pad oxide layer and a pad nitride layer sequentially to expose the field region on the semiconductor substrate;

etching the semiconductor substrate by using the pad nitride layer as an etching barrier, so as to form a trench;

forming a gap-fill oxide layer on the resultant trench in order to bury the trench;

performing a chemical and mechanical polishing for the gap-fill oxide layer until the pad nitride layer is exposed; and removing the remaining pad nitride layer and pad oxide layer after the chemical and mechanical polishing.

3. The method of claim 2, wherein the pad oxide layer has a thickness of 50~150 Å.

4. The method of claim 2, wherein the pad nitride layer has a thickness of 500~700 Å.

5. The method of claim 2, wherein the trench has a depth of 2000~3000 Å.

6. The method of claim 1, wherein the first and second hard mask layers are an oxide layer.

7. The method of claim 1, wherein the first and second hard mask layers are formed to have a thickness of 50~100 Å.

8. The method of claim 1, wherein the predetermined depth is in the range of 400~600 Å.

9. The method of claim 1, wherein a gate oxide layer, a doped polysilicon layer, a tungsten suicide layer, and a gate hard mask layer are sequentially formed on the channel area to form the gate.

10. The method of claim 9, wherein the gate oxide layer has a thickness of 30~50 Å.

11. The method of claim 9, wherein the doped polysilicon layer has a thickness of 400~700 Å.

12. The method of claim 9, wherein the tungsten silicide has a thickness of 1000~1500 Å.

13. The method of claim 9, wherein the gate hard mask layer has a thickness of 2000~2500 Å.

14. The method of claim 1, wherein the first portion of the active region extending from the first field area by a first width, and wherein the second portion of the active region extending from the second field area by a second width, wherein the first and second widths are same or different from each other.

* * * * *